US011031170B2

(12) United States Patent
Someya et al.

(10) Patent No.: US 11,031,170 B2
(45) Date of Patent: Jun. 8, 2021

(54) COIL DEVICE

(71) Applicant: TDK CORPORATION, Tokyo (JP)

(72) Inventors: Shuhei Someya, Tokyo (JP); Tasuku Mikogami, Tokyo (JP)

(73) Assignee: TDK CORPORATION, Tokyo (JP)

( * ) Notice: Subject to any disclaimer, the term of this patent is extended or adjusted under 35 U.S.C. 154(b) by 203 days.

(21) Appl. No.: 16/122,090

(22) Filed: Sep. 5, 2018

(65) Prior Publication Data

US 2019/0080834 A1   Mar. 14, 2019

(30) Foreign Application Priority Data

Sep. 11, 2017 (JP) .............................. JP2017-174390

(51) Int. Cl.
*H01F 27/29* (2006.01)
*H01F 17/04* (2006.01)
*H01F 27/28* (2006.01)
*H05K 1/18* (2006.01)
*H05K 1/14* (2006.01)

(52) U.S. Cl.
CPC ....... *H01F 17/045* (2013.01); *H01F 27/2828* (2013.01); *H01F 27/292* (2013.01); *H01F 27/2823* (2013.01); *H05K 1/141* (2013.01); *H05K 1/181* (2013.01)

(58) Field of Classification Search
CPC .. H01F 17/045; H01F 27/2823; H01F 27/292; H01F 27/2828; H05K 1/141; H05K 1/181
USPC .................................................. 336/192, 83
See application file for complete search history.

(56) References Cited

U.S. PATENT DOCUMENTS

| 6,027,008 | A | 2/2000 | Toi et al. | |
|---|---|---|---|---|
| 6,119,924 | A * | 9/2000 | Toi ....................... | B23K 20/023 228/179.1 |
| 6,472,969 | B1 * | 10/2002 | Hanato ................ | H01F 17/045 336/192 |
| 2001/0038327 | A1 * | 11/2001 | Aoki ..................... | H01F 27/027 336/83 |
| 2002/0057160 | A1 * | 5/2002 | Hanato ................ | H01F 27/027 336/83 |
| 2006/0071749 | A1 * | 4/2006 | Aoki ..................... | H01F 17/045 336/83 |
| 2008/0003864 | A1 * | 1/2008 | Hatakeyama ........ | H01F 27/292 439/399 |
| 2012/0133469 | A1 * | 5/2012 | Tomonari ............. | H01F 27/292 336/192 |
| 2013/0194060 | A1 * | 8/2013 | Nakada ................. | H01F 1/33 336/192 |
| 2018/0061556 | A1 * | 3/2018 | Wakabayashi ....... | H01F 27/292 |

FOREIGN PATENT DOCUMENTS

| CN | 1208322 A | 2/1999 |
|---|---|---|
| JP | H08-31644 A | 2/1996 |
| JP | 2004-146662 A | 5/2004 |

* cited by examiner

Primary Examiner — Mang Tin Bik Lian
(74) Attorney, Agent, or Firm — Oliff PLC

(57) ABSTRACT

A coil device includes a coil, a core, and an electrode. The coil is formed by winding a wire. The core is provided with the coil. The electrode has a wire joint part configured to be connected with a wire end of the wire. A mount surface of the electrode is at least partially covered with a cover layer.

17 Claims, 11 Drawing Sheets

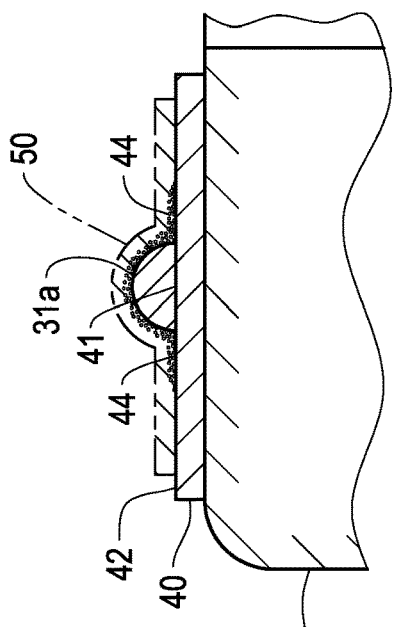
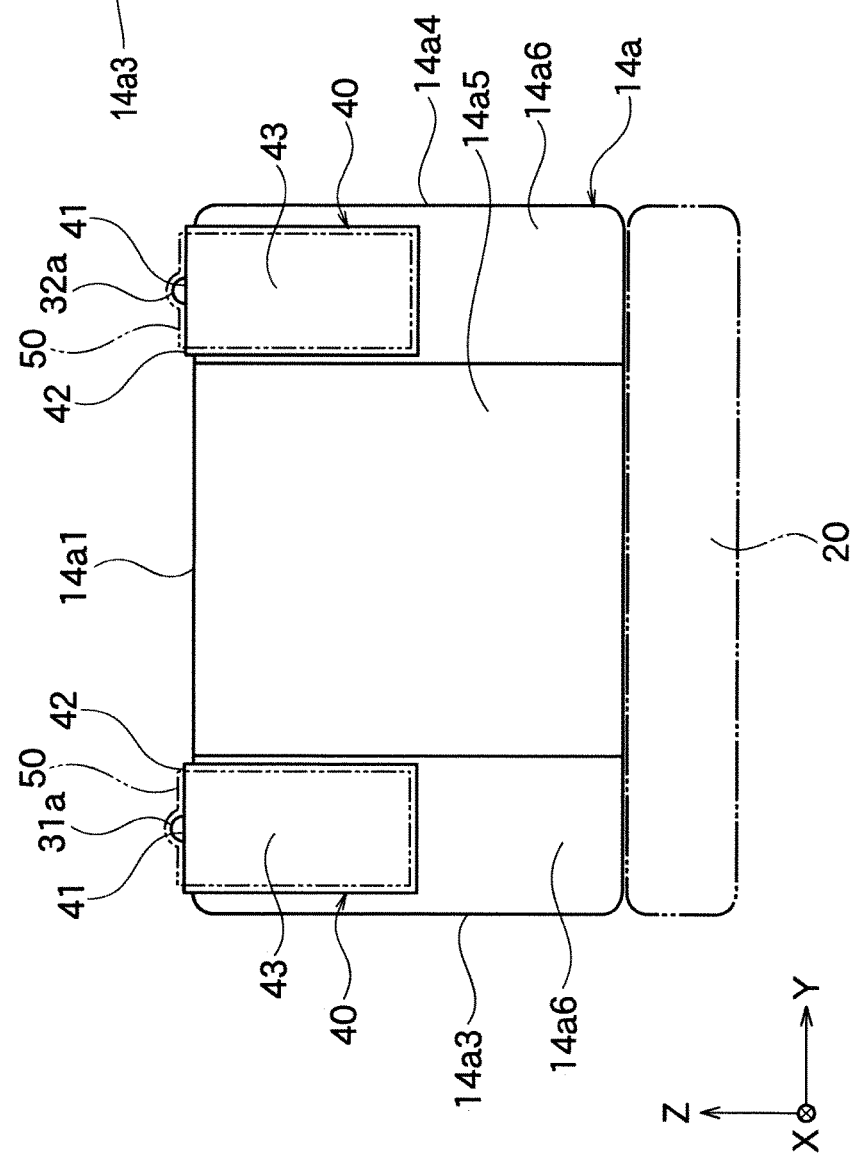

COIL DEVICE

BACKGROUND OF THE INVENTION

The present invention relates to a coil device used as, for example, a transformer.

Examples of conventional coil devices include the coil device of Patent Document 1. The coil device of Patent Document 1 is a surface-mount type coil device, and an electrode is formed on a mount surface of this coil device.

In the coil device of Patent Document 1, however, if a wire end of a wire is connected with the electrode by thermocompression bonding or so, the mount surface of the electrode may have a decreased solder wettability, and mount failures may occur.

Patent Document 1: JPH0831644 (A)

BRIEF SUMMARY OF INVENTION

The present invention has been achieved under each circumstances. It is an object of the invention to provide a coil device having an electrode capable of preventing mount failures.

The present inventors have earnestly studied the above object and consequently found that mount failures can be prevented by covering a mount surface with a cover layer after a wire end of a wire is connected with an electrode using thermocompression bonding or so. Therefore, the present invention has been achieved.

That is, a coil device according to the present invention comprises:

a coil formed by winding a wire;
a core provided with the coil; and
an electrode having a wire joint part configured to be connected with a wire end of the wire, wherein a mount surface of the electrode is at least partially covered with a cover layer.

In the coil device according to the present invention, a mount surface of the electrode is at least partially covered with a cover layer. Thus, when the electrode is subjected to thermocompression bonding or so, even if the mount surface is influenced by heat of thermocompression bonding or so, the influence of heat can be reduced, and mount failures can be prevented.

Preferably, the cover layer is composed of a metal film. Preferably, the metal film contains at least one of Au, Ag, Pt, Cu, Sn, and an alloy containing at least one of these elements. When the cover layer is composed of the metal film containing these metals, the mount surface of the electrode can be covered with the cover layer with a high solder wettability. Thus, the cover layer with a high solder wettability can cover a part of the mount surface with a decreased solder wettability due to heat of thermocompression bonding or so, and the mount surface can have an increased solder wettability. Thus, the joint between the mount surface and a circuit board or so via the cover layer can secure a sufficient mount area, improve a mount strength to a circuit board or so, and effectively prevent mount failures.

Preferably, the cover layer is formed by a thin film.

The wire joint part may be formed on the mount surface of the electrode, and the cover layer may cover the wire joint part. In this structure, the cover layer can cover a part (wire joint part) influenced by heat of thermocompression bonding or so subjected to the mount surface so that this part is not exposed from the mount surface. Thus, the influence of heat can be reduced, and mount failures can be prevented.

The mount surface of the electrode may comprise a first mount surface and a second mount surface connected with the first mount surface via a step formed therebetween, and the wire joint part may be formed on the second mount surface. In this structure, the first mount surface can be used as a joint surface to a circuit board or so, and it is possible to secure a large mount area, improve a mount strength to a circuit board or so, and effectively prevent mount failures.

When the first mount surface is joined with a circuit board or so, a space corresponding to a height of the step is formed between the second mount surface and a circuit board or so. When the second mount surface is covered with the cover layer, this space is easily filled with solder, and this solder contributes to the joint with a circuit board or so. Thus, a circuit board or so is joined not only with the first mount surface but with the second mount surface, and a mount strength to a circuit board or so can effectively be improved.

The wire joint part may be formed on a surface of the electrode differing from the mount surface. In this structure, even if the mount surface is influenced by heat of heat treatment subjected to a surface of the electrode differing from the mount surface, the portion influenced by heat can be covered with the cover layer so as not to be exposed from the mount surface. Thus, the influence of heat can be reduced, and mount failures can be prevented.

In the above-mentioned structure, a solder fillet can be formed on a surface of the electrode differing from the mount surface. Thus, a mount strength to a circuit board or so can effectively be improved, and mount failures can effectively be prevented.

The core may comprise a winding core and flanges formed on both ends of the winding core, the wire may be wound around the winding core, and the electrode may be formed on a surface of the flange. In this structure, for example, mount failures of a coil device having a drum core can be prevented.

The electrode may further comprise a mount auxiliary surface formed on an end surface of the flange, and the wire joint part may be formed on the mount auxiliary surface. In this structure, a solder fillet can be formed on the mount auxiliary surface. Thus, a mount strength to a circuit board or so can effectively be improved, and mount failures can effectively be prevented.

In the above-mentioned structure, the cover layer can cover a portion (wire joint part) influenced by heat of heat treatment subjected to the mount auxiliary surface so that this portion is not exposed from the mount auxiliary surface. Thus, the influence of heat can be reduced, and a solder fillet can sufficiently be formed on the mount auxiliary surface. Incidentally, similar effects can be obtained even if another adhesive means, such as a conductive adhesive, is used.

The electrode may comprise a metal terminal fitting, a plating pattern, or a printing pattern.

BRIEF DESCRIPTION OF DRAWINGS

FIG. 1C is a side view of the coil device shown in FIG. 1A seen from the direction of Arrow IC.

FIG. 1D is an exploded view of a portion of FIG. 1C.

DETAILED DESCRIPTION OF INVENTION

Hereinafter, the present invention is described based on the embodiments shown in the figures.

First Embodiment

Figure 1A:
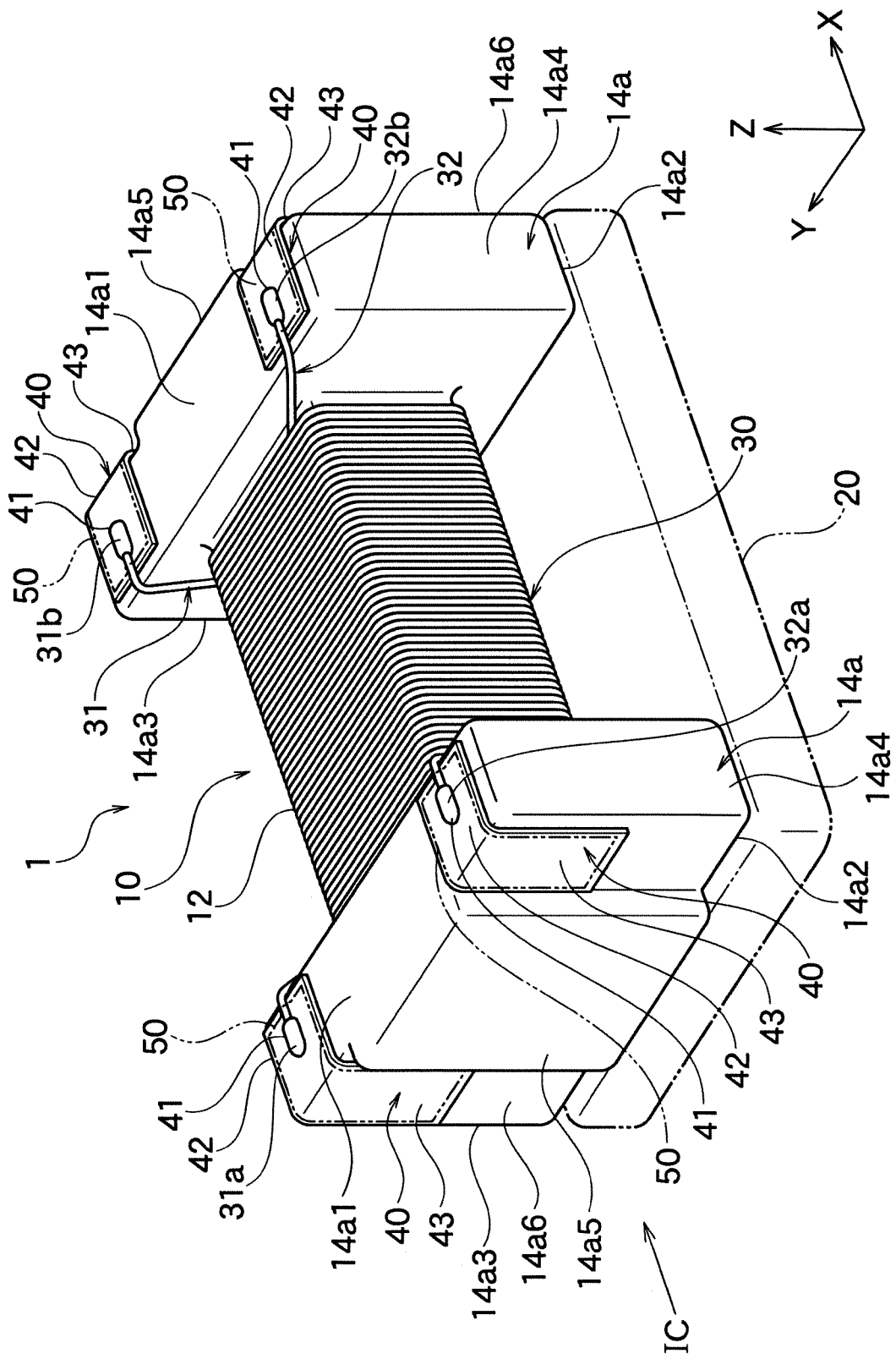
FIG. 1A a whole perspective view of a coil device according to First Embodiment of the present invention.

As shown in FIG. 1A, a coil device 1 according to First Embodiment of the present invention has a drum core 10, a plate member 20, a coil 30 wound around a winding core 12 of the drum core 10, and electrodes 40. The drum core 10 is provided with the coil 30.

In the description of the coil device 1, the X-axis direction is a parallel direction to a winding axis of the winding core 12 of the drum core 10 within a parallel plane to a mount surface of the coil device 1, the Y-axis direction is a perpendicular direction to the X-axis direction within a parallel plane to the mount surface similarly to the X-axis direction, and the Z-axis direction is a normal direction to the mount surface. Hereinafter, the positive side in the Z-axis direction is the upper side, and the negative side in the Z-axis direction is the lower side.

The coil device 1 has any external size, such as a length in the X-axis direction of 4.3 to 4.7 mm, a height in the Z-axis direction of 2.6 to 3.0 mm, and a width in the Y-axis direction of 3.0 to 3.4 mm.

The drum core 10 has the winding core 12 and a pair of flanges 14a and 14a. The winding core 12 has a winding axis in the X-axis direction and a rectangular cross section that is longer in the Y-axis direction. The pair of flanges 14a and 14a is arranged on both ends of the winding core 12 in the X-axis direction. The winding core 12 has a rectangular cross section in the present embodiment, but may have any cross-sectional shape, such as circle and generally octagon.

Each of the flanges 14a and 14a has a substantially rectangular parallelepiped outer shape extending in the Y-axis direction and is arranged to be substantially parallel to each other with a predetermined distance in the X-axis direction. Each of the flanges 14a and 14a has a rectangular cross-sectional shape, but may have any cross-sectional shape, such as circle and generally octagon. The winding core 12 is connected with central areas of surfaces of the pair of flanges 14a and 14a facing each other and connects the pair of flanges 14a and 14a.

As shown in FIG. 1A, a first wire 31 and a second wire 32 are wound around the winding core 12, and the coil 30 is formed by winding one or more layers of the wires 31 and 32. The wires 31 and 32 are formed by, for example, a cover conducting wire, and are formed by covering a core material of good conductor with an insulation cover film. In the present embodiment, conductor portions of the wires 31 and 32 have the same cross-sectional area, but may have different cross-sectional areas. The coil 30 may be formed by one or more layers of a single wire, or may be formed by one or more layers of three or more wires.

In the present embodiment, the wires 31 and 32 have substantially the same winding number, but may have different winding numbers depending on usage. Incidentally, "the wires 31 and 32 have substantially the same winding number" means that a ratio of winding numbers of the wires 31 and 32 is within (0.75 to 1)/0.75.

As shown in FIG. 1A, side step surfaces 14a6 and 14a6 recessed inward in the X-axis direction (toward the center of the winding core 12 in the X-axis direction) are provided on both sides of an end surface 14a5 of each flange 14a in the Y-axis direction. The side step surfaces 14a6 and 14a6 are respectively provided with a mount auxiliary part 43 of the electrode 40 mentioned below.

A first plane surface 14a1 is formed on the top of each flange 14a in the Z-axis direction. The first plane surfaces 14a1 and 14a1 are a mount surface (installation surface) where the coil device 1 is mounted on, for example, a circuit board.

A second plane surface 14a2 is formed on the bottom of each flange 14a in the Z-axis direction. The plate member 20 is disposed on the second plane surfaces 14a2.

As shown in FIG. 1A, the electrodes 40 are formed on the surface of one of the flanges 14a of the drum core 10 with a predetermined distance in the Y-axis direction, and the electrodes 40 are similarly formed on the surface of the other flange 14a of the drum core 10 with a predetermined distance in the Y-axis direction. In the example of FIG. 1A, each of the electrodes 40 is formed over the first plane surface 14a1 and the side step surface 14a6. The electrodes 40 adjacent to each other are positioned with any distance that secures insulation therebetween.

In the present embodiment, each of the electrodes 40 is formed by a mount part (mount surface) 42 parallel to the X-Y plane and a mount auxiliary part 43 parallel to the Y-Z plane, and the mount part 42 and the mount auxiliary part 43 are electrically connected. The mount parts 42 are formed on both sides of the first plane surface 14a1 of each flange 14a in the Y-axis direction. The mount auxiliary parts 43 are a place where a solder fillet is formed. Since a solder fillet is formed on the mount auxiliary parts 43, the coil device 1 is mounted more strongly on a circuit board or so, and mount failures can be prevented.

The mount parts 42 are configured to be joined with a circuit board or so. When the coil device 1 is mounted on a circuit board or so, the mount parts 42 are a solder joint surface with an electrode of a circuit board or so.

In the present embodiment, a wire joint part 41 is formed on each of the mount parts 42. Wire ends 31a, 31b, 32a, and 32b of the wires 31 and 32 constituting the coil 30 are connected with the electrodes 40 by various heat treatments, such as thermocompression bonding and laser. That is, the wire ends 31a and 31b of the first wire 31 are respectively connected to the wire joint parts 41 of the electrodes 40 formed on one end of each flange 14a in the Y-axis direction, and the wire ends 32a and 32b of the second wire 32 are respectively connected to the wire joint parts 41 of the electrodes 40 formed on the other end of each flange 14a in the Y-axis direction.

The mount auxiliary part 43 of each electrode 40 has a length in the Z-axis direction that is about ¼ to ⅔ of a length of the side step surface 14a6 of each flange 14a in the Z-axis direction. That is, the mount auxiliary parts 43 are respectively formed on about ¼ to ⅔ of the side step surface 14a6 from the upper end thereof.

The electrodes 40 are formed by, for example, a metal paste baked film, a metal plating film, or the like. The electrodes 40 are formed respectively in such a manner that the side step surface 14a6 and the surface of the first plane surface 14a1 of each flange 14a is applied with an Ag paste or so, baked, and thereafter provided with a plating film by electric field plating or electroless plating, for example.

Incidentally, the metal paste is any material, such as Cu paste and Ag paste. The plating film may be a single layer or plural layers, and is, for example, Cu plating, Ni plating, Sn plating, Ni—Sn plating, Cu—Ni—Sn plating, Ni—Au plating, Au plating, etc. Each of the electrodes 40 has any thickness, but preferably has a thickness of 0.1 to 15 μm.

As shown in FIG. 1A, each of the electrodes 40 is covered with a cover layer 50. The cover layers 50 are formed by a metal film and contain at least one of Au, Ag Pt, Cu, Sn, and an alloy of these metals.

Preferably, the cover layers 50 are formed by thin film method. Each of the cover layers 50 preferably has a thickness TH1 (average thickness or maximum thickness) of 5 to 20 μm, and more preferably has a thickness TH1 of 10 to 15 μm.

Incidentally, each of the cover layers 50 does not necessarily have a uniform thickness, and may have a larger thickness at a part that is influenced by heat of heat treatment mentioned below, compared to the other parts.

The cover layers 50 of thin film may be formed by any method, such as deposition and sputtering.

In the present embodiment, each of the cover layers 50 covers the mount part 42 and the mount auxiliary part 43 of the electrode 40, but may cover only the mount part 42. Each of the cover layers 50 covers the entire mount part 42, but may cover a part of the mount part 42. That is, each of the cover layers 50 should cover at least a part of the mount part (mount surface) 42 of the electrode 40.

In the present embodiment, when the wire ends 31a, 31b, 32a, and 32b of the wires 31 and 32 are connected with the electrodes 40 by heat treatment of thermocompression bonding or so, each of the cover layers 50 particularly covers at least a deteriorated part of the electrode 40 due to the heat.

That is, when the electrodes 40 are subjected to a heat treatment, for example, this heat melts the wire cover films covering the wires 31 and 32, and their residues (cover film dregs 44) may remain or a different phase (a phase whose main component is carbon) may be generated due to the molten wire cover films. Moreover, an alloy layer that deteriorates solder wettability (a reactant between the core material of the wires and the plating or so formed on the electrodes 40) may be formed in the heated part due to the heat.

When the wire joint parts 41 are formed on the mount parts 42 as shown in the present embodiment, the mount parts 42 are influenced by heat of heat treatment in the connection of the wire ends 31a, 31b, 32a, and 32b of the wires 31 and 32 with the mount parts 42. In particular, the wire joint parts 41 (also their vicinities) are remarkably influenced by heat, such as the formation of alloy layer and the residues of cover film dregs 44. Moreover, the heat applied to the mount parts 42 travels to the mount parts 42, and the mount auxiliary parts 43 are thereby influenced by heat of heat treatment subjected to the mount parts 42. In the present embodiment, the cover layers 50 thereby cover the mount parts 42 and the mount auxiliary parts 43 as parts influenced by heat of heat treatment.

Figure 1B:
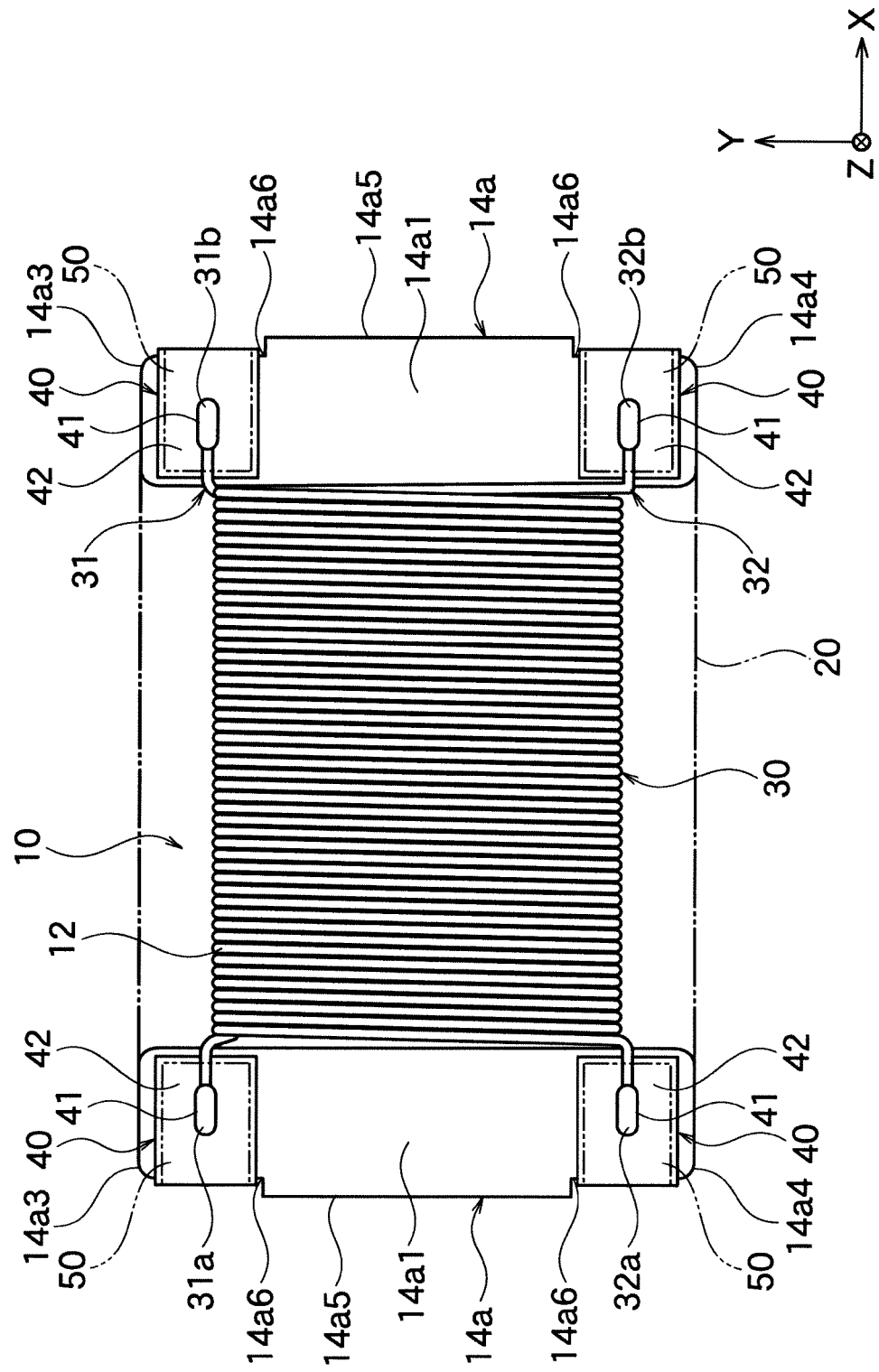
FIG. 1B is a plane view of the coil device shown in FIG. 1A.

Each of the cover layers 50 covering the mount parts 42 covers the wire joint part 41 and its vicinity (entire mount part 42) as shown in FIG. 1B, but may locally cover only a part of the mount part 42. For example, each of the cover layers 50 may cover only the wire joint part 41 (wire joint part and its vicinity), which is easily influenced by heat of heat treatment, of the mount part 42.

Each of the cover layers 50 covering the mount auxiliary parts 43 covers the entire mount auxiliary part 43 as shown in FIG. 1C, but may locally cover only a part of the mount auxiliary part 43. For example, each of the cover layers 50 may cover only a boundary part between the mount part 42 and the mount auxiliary part 43, which is easily influenced by heat of heat treatment.

If the cover layers 50 are composed of the above-mentioned various metals, a cover layer 50 with a high solder wettability (not only solder but another joint means such as conductive adhesive) is formed on the mount part 42 and the mount auxiliary part 43. Thus, a part of the electrode 40 that is covered with the cover layer 50 and influenced by heat has a solder wettability that is higher than a solder wettability of a part of the electrode 40 that is not covered with the cover layer 50.

In the manufacture of the coil device 1, the drum core 10, the plate member 20, and the wires 31 and 32 are initially prepared. The drum core 10 and the plate member 20 are preferably different magnetic members, and these magnetic members may be composed of different magnetic materials.

For example, the magnetic materials are a magnetic material having a comparatively high permeability, such as Ni—Zn based ferrite, Mn—Zn based ferrite, and a metal magnetic material. Powders of these magnetic materials are molded and sintered, and the drum core 10 and the plate member 20 are thereby manufactured. In the drum core 10, the winding core 12 and the flanges 14a and 14a are formed integrally.

Next, a metal paste is applied to the flanges 14a and 14a of the drum core 10 and baked at a predetermined temperature. Then, this baked surface is subjected to electric field plating or electroless plating, and the electrodes 40 are formed.

Next, the drum core 10 with the electrodes 40 and the wires 31 and 32 are set to a winding machine, and the wires 31 and 32 are thereby wound around the winding core 12 of the drum core 10 at a predetermined order. For example, the wires 31 and 32 can be formed by covering a core material of good conductor, such as copper (Cu), with an insulation material of imide metamorphosed polyurethane and further covering the outermost surface with a thin resin film, such as polyester.

At the same time or after that, the wire ends 31a, 31b, 32a, and 32b of the wires 31 and 32 are connected with the wire joint parts 41 of the electrodes 40 by any method. For example, the wire ends 31a, 31b, 32a, and 32b of the wires 31 and 32 are subjected to thermocompression bonding with the electrodes 40 (the mount parts 42 in the present embodiment) by pushing a heater chip against the wire ends 31a, 31b, 32a, and 32b while the wire ends 31a, 31b, 32a, and 32b are being sandwiched by the electrodes 40 and the heater chip. The wire ends 31a, 31b, 32a, and 32b are connected with a substantially central area of each mount part 42 in the illustrated example, but may be connected with a periphery of each mount part 42.

Next, each of the electrodes 40 is masked by SUS mask etc. except for the mount part 42 and the mount auxiliary part 43 so that these parts are exposed, and a metal material containing Au etc. is deposited on each of the electrodes 40 joined with the wires 31 and 32 from above the wire joint part 41, whereby the cover layers 50 are formed. Incidentally, the insulation material covering the cores of the wires 31 and 32 is covered with the cover layers 50 even if the insulation material is molten by heat of thermocompression bonding, and the cover films of the wires 31 and 32 do not thereby need to be removed.

In the present embodiment, each of the mount parts 42 of the electrodes 40 is entirely covered with the cover layer 50. Thus, when each of the electrodes 40 is subjected to thermocompression bonding or so, even if each of the mount parts 42 (specifically, around the wire joint parts 41) is influenced by heat of thermocompression bonding or so, the influence of heat (influence by cover film dregs 44 or so) can be reduced, and mount failures can be prevented.

In the present embodiment, the cover layers 50 are respectively formed by a metal film containing at least one of Au, Ag, Pt, Cu, Sn, and an alloy of these metals, and the mount part 42 of each electrode 40 is covered with a cover layer 50 with a high solder wettability. Thus, each of the cover layers 50 with a high solder wettability covers the wire joint part 41 with a decreased solder wettability due to heat of thermocompression bonding or so, and the mount parts 42 can have an increased solder wettability. Thus, the joint between the mount parts 42 and a circuit board or so via the cover layers 50 can secure a sufficient mount area, improve a mount strength to a circuit board or so, and effectively prevent mount failures.

In the present embodiment, the wire joint parts 41 are formed on the mount parts 42 of the electrodes 40, and the cover layers 50 cover the wire joint parts 41. Thus, the cover layers 50 can cover a part (wire joint parts 41) influenced by heat of thermocompression bonding or so subjected to the mount parts 42 so that this part is not exposed from the mount parts 42. Thus, the influence of heat can be reduced, and mount failures can be prevented.

Second Embodiment

Figure 2A:
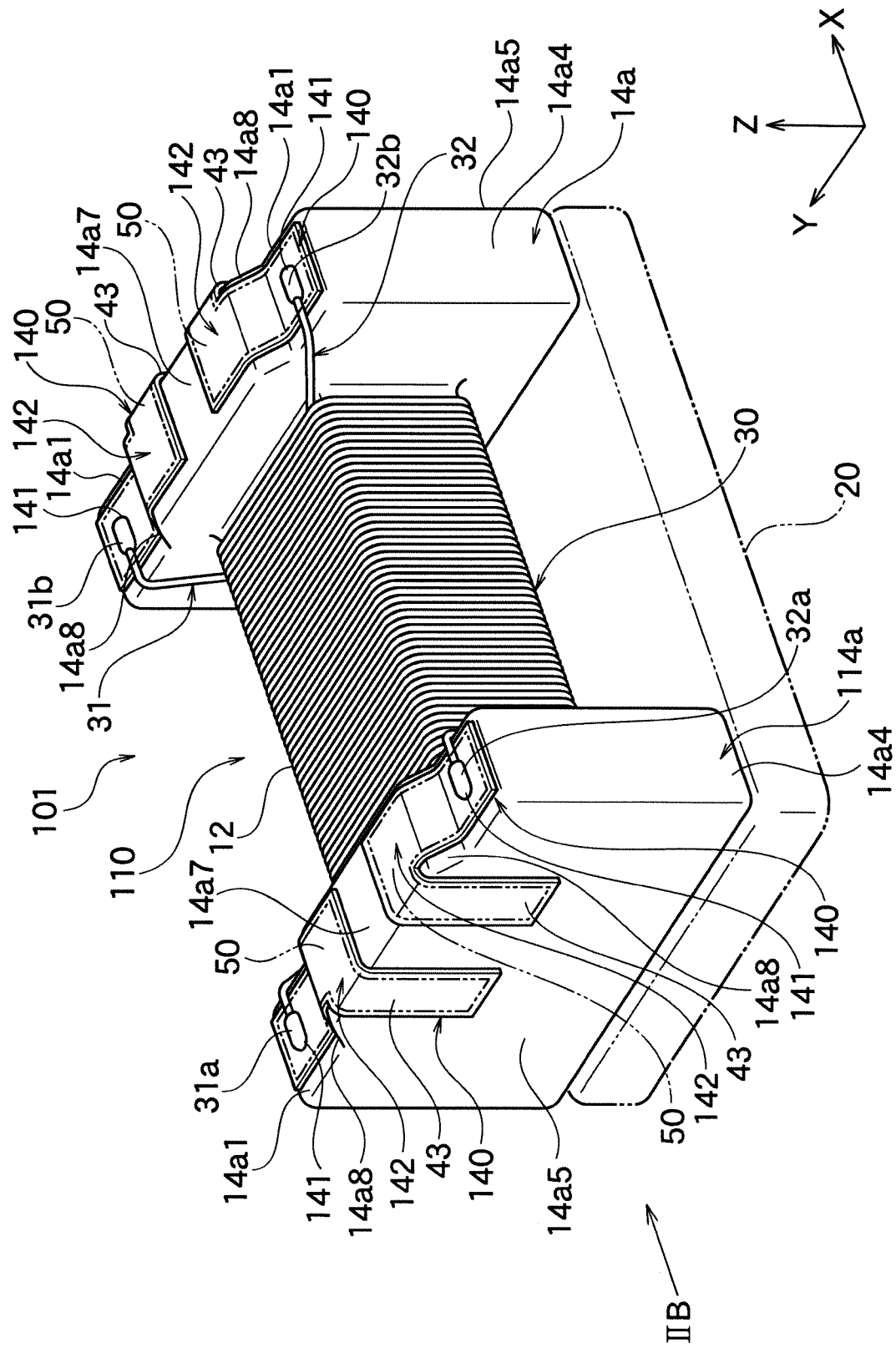
FIG. 2A is a whole perspective view of a coil device according to another embodiment of the present invention.
Figure 2B:
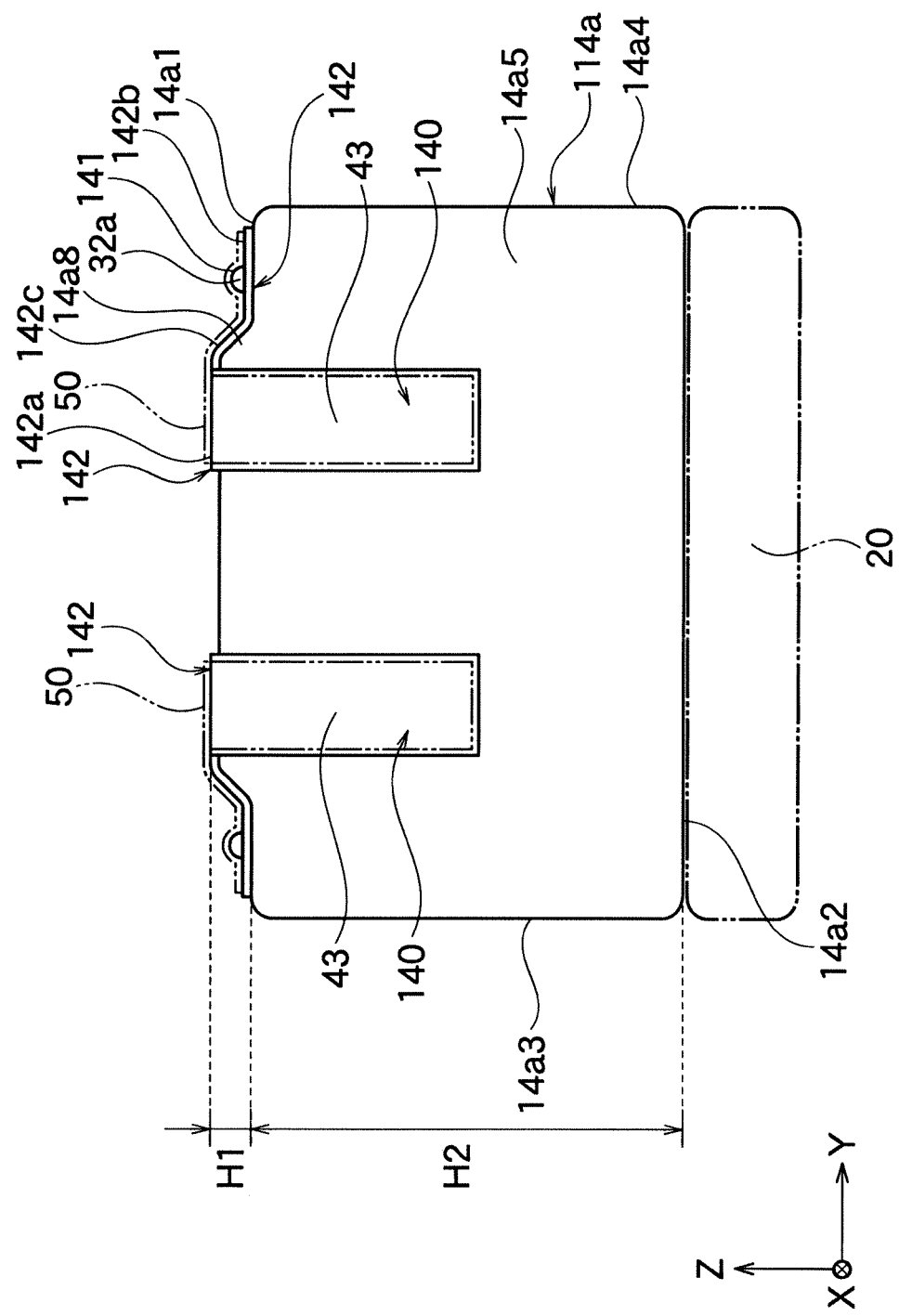
FIG. 2B is a side view of the coil device shown in FIG. 2A seen from the direction of Arrow IIB.

As shown in FIG. 2A and FIG. 2B, a coil device 101 according to the present embodiment is similar to the coil device 1 according to First Embodiment except for the structures of flanges 114a and 114a and electrodes 140. Hereinafter, different matters from First Embodiment are described in detail, and common matters are not described. Common members are provided with common references in the figures, and the description of common members is partially omitted.

Each of the flanges 114a and 114a has an upper step surface 14a7 and inclined surfaces 14a8, in addition to the first plane surface 14a1, the second plane surface 14a2, the first side surface 14a3, the second side surface 14a4, and the end surface 14a5.

The upper step surface 14a7 is formed at a position that is higher than the first plane surface 14a1 in the Z-axis direction. As shown in FIG. 2B, H1/H2 (ratio) is preferably 0.01 to 0.25, where H1 is a height from the first plane surface 14a1 to the upper step surface 14a7, and H2 is a height from the first plane surface 14a1 to the second plane surface 14a2.

The inclined surfaces 14a8 are formed on both sides of the upper step surface 14a7 in the Y-axis direction and connect between the first plane surface 14a1 and the upper step surface 14a7. An inclined angle θ to the X-Y plane of each inclined surface 14a8 can appropriately be selected within $0° < θ ≤ 90°$.

Each of the electrodes 140 has a mount part 142 and a mount auxiliary part 43. As shown in FIG. 2B, each of the mount parts 142 has a first mount part 142a, a second mount part 142b, and a step 142c. Each of the step 142c is formed on the inclined surface 14a8 and connects between the first mount part 142a and the second mount part 142b.

The first mount parts 142a are formed on both sides of the upper step surface 14a7 of each flange 114a in the Y-axis direction. In the present embodiment, the first mount parts 142a function as a role of a solder joint surface to a circuit board or so.

The second mount parts 142b are formed on both sides of the first plane surface 14a1 of each flange 114a in the Y-axis direction. In the present embodiment, a wire joint part 141 is formed on each of the second mount parts 142b and is formed on a surface of the electrode 140 differing from the solder joint surface (first mount part 142a). Incidentally, the second mount parts 142b may function as a role of a solder joint surface to a circuit board or so and may entirely be joined with a circuit board or so.

As shown in FIG. 2A, each of the electrodes 140 is covered with the cover layer 50. In the present embodiment, each of the cover layers 50 covers the mount part 142 and the mount auxiliary part 43 of the electrodes 140. For more detail, each of the cover layers 50 covers the first mount part 142a, the second mount parts 142b, and the step 142c.

In the illustrated example, each of the cover layers 50 covers the entire electrode 140, but may cover a part of the electrode 140. For example, each of the cover layers 50 may cover only the mount part 142 (or only the second mount part 142b) easily influenced by heat of heat treatment.

In the present embodiment, the mount parts 142 of the electrodes 140 respectively have the first mount part 142a and the second mount part 142b connected with the first mount part 142a via the step 142c, and the wire joint part 141 is formed on the second mount part 142b. Thus, the first mount parts 142a can be used as joint surfaces to a circuit board or so, and it is possible to secure a large mount area, improve a mount strength to a circuit board or so, and effectively prevent mount failures.

When the first mount parts 142a are joined with a circuit board or so, a space corresponding to a height of the steps 142c is formed between the second mount parts 142b and a circuit board or so. When the second mount parts 142b are covered with the cover layers 50, this space is easily filled with solder, and this solder contributes to the joint with a circuit board or so. Thus, a circuit board or so is joined not only with the first mount parts 142a but with the second mount parts 142b, and a mount strength to a circuit board or so can effectively be improved.

Third Embodiment

Figure 3A:
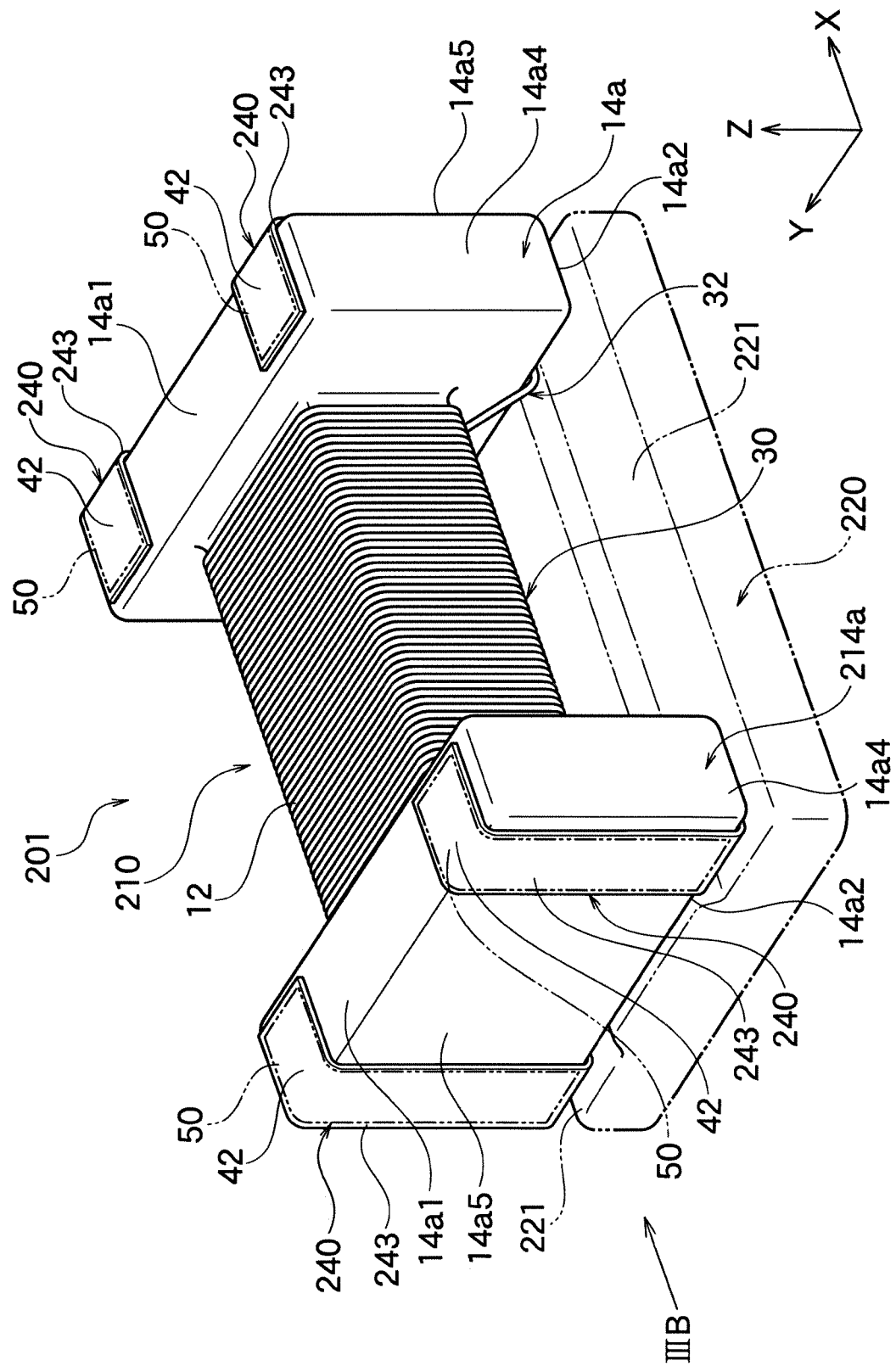
FIG. 3A is a whole perspective view of a coil device according to another embodiment of the present invention.
Figure 3B:
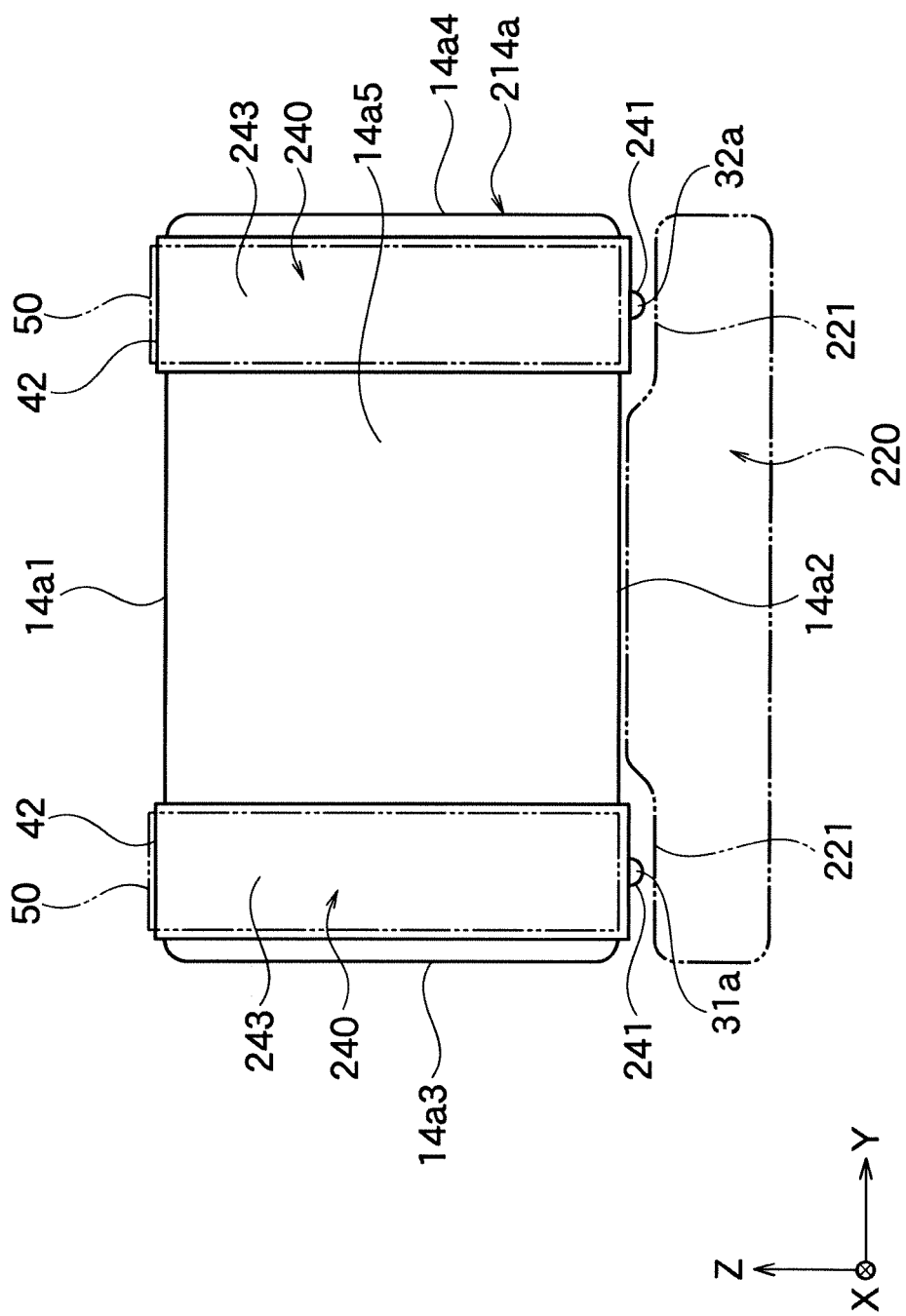
FIG. 3B is a side view of the coil device shown in FIG. 3A seen from the direction of Arrow IIIB.

As shown in FIG. 3A and FIG. 3B, a coil device 201 according to the present embodiment is similar to the coil device 1 according to First Embodiment except for the structures of flanges 214a and 214a, electrodes 240, and a plate member 220. Hereinafter, different matters from First Embodiment are described in detail, and common matters are not described. Common members are provided with common references in the figures, and the description of common members is partially omitted.

As shown in FIG. 3A, each of the flanges 214a and 214a according to the present embodiment is different from the flanges 14a and 14a according to First Embodiment in that each of the flanges 214a and 214a according to the present embodiment has the first plane surface 14a1, the second plane surface 14a2, the first side surface 14a3, the second side surface 14a4, and the end surface 14a5 and does not have the side step surfaces 14a6.

Each of the electrodes 240 has the mount part 42 and a mount auxiliary part 243. Each of the mount auxiliary parts 243 is formed over the end surface 14a5 and the second plane surface 14a2 and has a substantially "L" outer shape. As shown in FIG. 3B, wire joint parts 241 are respectively formed on the mount auxiliary part 243 of the second plane surface 14a2 so as to face the plate member 220. That is, the wire joint parts 241 are respectively formed on a surface of the electrode 240 differing from the mount part 42 in the present embodiment.

Notches 221 are formed in the X-axis direction on both sides of the plate member 220 in the Y-axis direction. Thus, when the plate member 220 is placed on the flanges 214a and 214a, as shown in FIG. 3B, a space is formed between the second plane surface 14a2 and each of four inner corners of the plate member 220. Thus, when the plate member 220 is placed on the flanges 214a and 214a, the four inner corners of the plate member 220 do not contact with the wire joint parts 241 and do not adversely affect the connection with the wire joint parts 241.

Incidentally, each of the notches 21 may have any widths in the X-axis direction, in the Y-axis direction, and the Z-axis direction as long as the four inner corners of the plate member 220 do not contact with the wire joint parts 241. Moreover, the notches 21 may respectively have any outer shape in the Z-axis direction, such as rectangle and sector.

As shown in FIG. 3A, the electrodes 240 are covered with the cover layers 50. In the present embodiment, each of the cover layers 50 covers the electrode 240 over the mount part 42 and the mount auxiliary part 243 of the end surface 14a5.

In the illustrated example, each of the cover layers 50 covers a part of the electrode 240 (the mount part 42 and the mount auxiliary part 243 of the end surface 14a5), but may entirely cover the electrode 240. Moreover, each of the cover layers 50 may cover only the mount part 42 easily influenced by heat of heat treatment.

In the present embodiment, the wire joint parts 241 are respectively formed on a surface of the electrode 240 differing from the mount part 42. Thus, even if each of the mount part 42 is influenced by heat of heat treatment subjected to a surface of the electrode 240 differing from the mount part 42 (the mount auxiliary part 243 of the second plane surface 14a2), the portion influenced by heat can be covered with the cover layer 50 so as not to be exposed from the mount part 41. Thus, the influence of heat can be reduced, and mount failures can be prevented.

Moreover, a solder fillet can be formed on a surface of the electrode 240 differing from the mount part 42 (mount auxiliary part 243). Thus, a mount strength to a circuit board or so can effectively be improved, and mount failures can effectively be prevented.

Fourth Embodiment

Figure 4A:
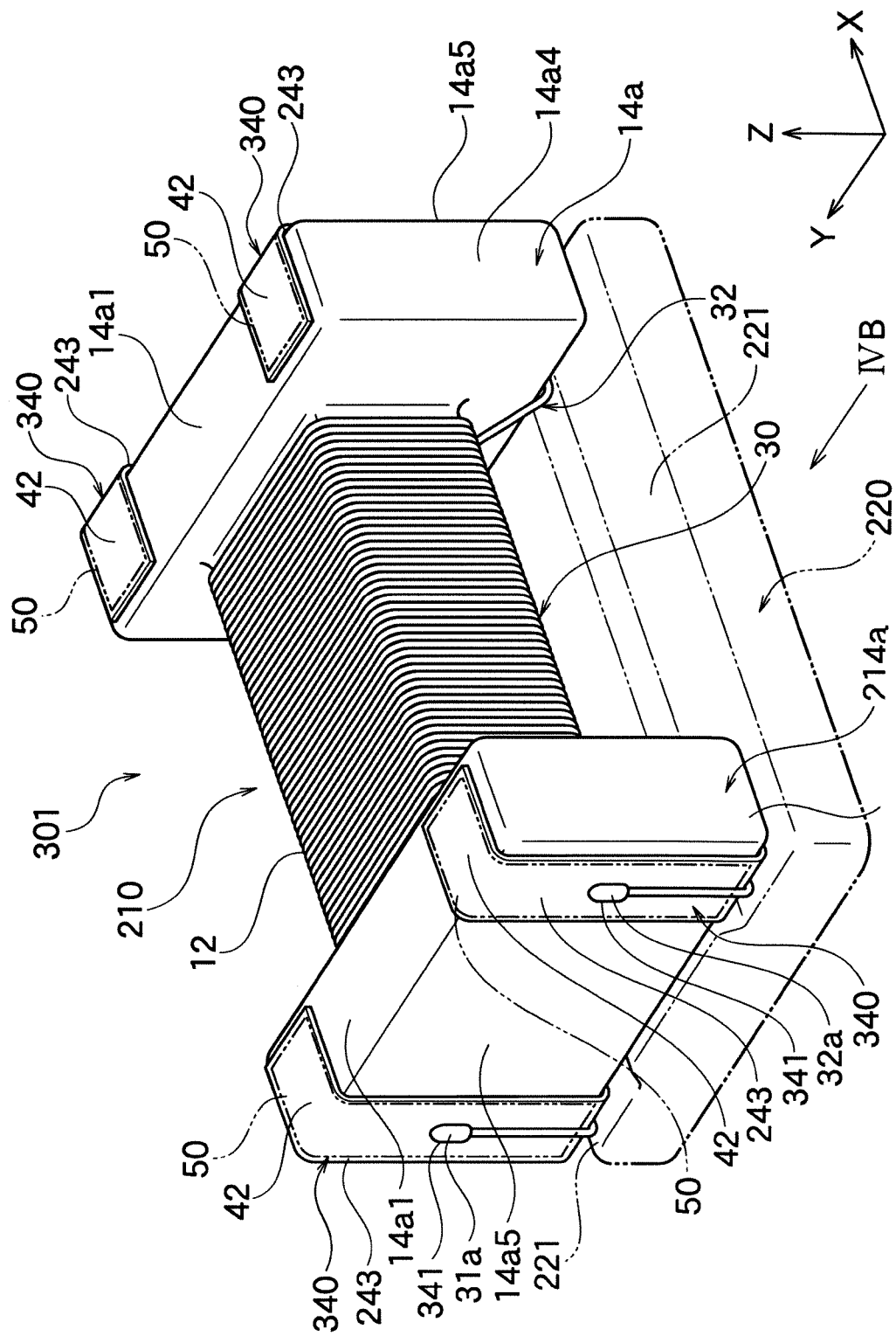
FIG. 4A a whole perspective view of a coil device according to another embodiment of the present invention.
Figure 4B:
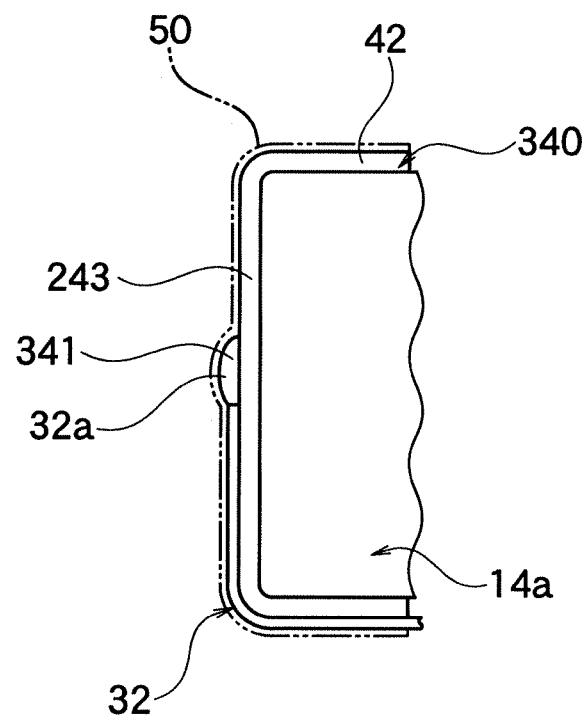
FIG. 4B is a partial side view of the coil device shown in FIG. 4A seen from the direction of Arrow IVB.

As shown in FIG. 4A and FIG. 4B, a coil device 301 according to the present embodiment is similar to the coil device 201 according to Third Embodiment except for the structure of electrodes 340. Hereinafter, different matters from Third Embodiment are described in detail, and common matters are not described. Common members are provided with common references in the figures, and the description of common members is partially omitted.

In the present embodiment, wire joint parts 341 are respectively formed on the mount auxiliary part 243 of the end surface 14a5. That is, each of the wire joint parts 341 is formed on a surface of the electrode 340 differing from the mount part 42 in the present embodiment.

As shown in FIG. 4A, each electrode 340 is covered with the cover layer 50. As shown in FIG. 4B, each cover layer 50 covers the mount part 42 and the mount auxiliary part 243 of the end surface 14a5.

In the illustrated example, each cover layer 50 covers a part of the electrode 340 (the mount part 42 and the auxiliary part 243 of the end surface 14a5), but may entirely cover the electrode 340.

In the present embodiment, each of the cover layers 50 covers the wire joint part 341 formed on the mount auxiliary part 243 of the end surface 14a5. Thus, each of the cover layers 50 can cover a portion (wire joint part 341) influenced by heat of heat treatment subjected to the mount auxiliary part 243 so that this portion is not exposed from the mount auxiliary part 243. Thus, the influence of heat can be reduced, and a solder fillet can sufficiently be formed on the mount auxiliary part 243. Incidentally, similar effects can be obtained even if another adhesive means, such as a conductive adhesive, is used.

Figure 4C:
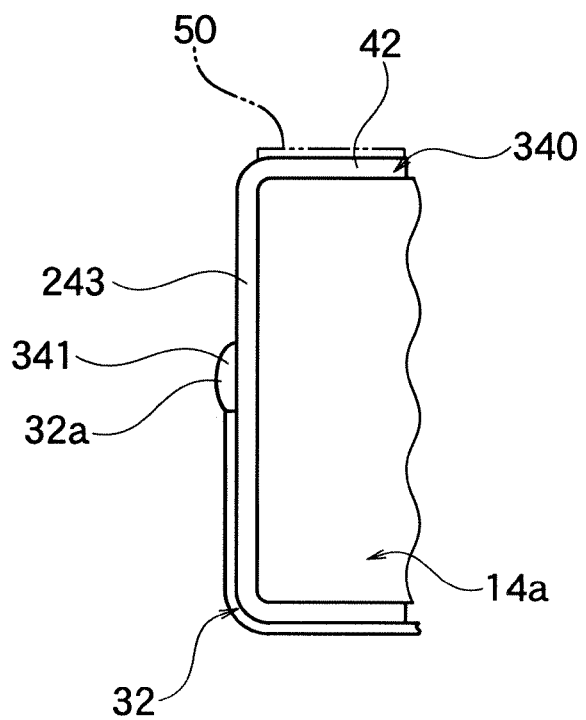
FIG. 4C is a partial side view illustrating a variation of the coil device shown in FIG. 4B.

Incidentally, each of the cover films 50 may cover only the mount part 42 as shown in FIG. 4C. In this case, even if the mount part 42 is influenced by heat of heat treatment subjected to the mount auxiliary part 243 of the end surface 14a5, the portion influenced by this heat can be covered with the cover layer 50 so as not to be exposed from the mount part 42. Thus, the influence of heat can be reduced, and mount failures can be prevented.

Figure 4D:
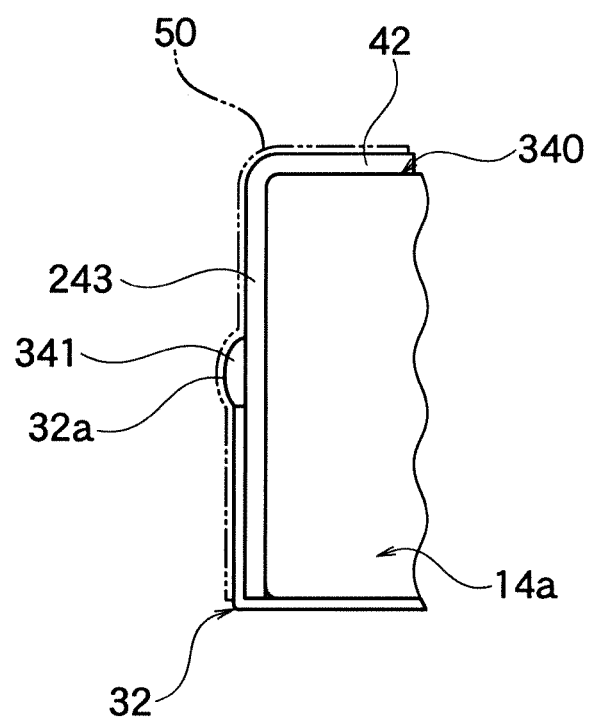
FIG. 4D is a partial side view illustrating another variation of the coil device shown in FIG. 4B.

As shown in FIG. 4D, each of the electrodes 340 may be simplified by eliminating the mount auxiliary part 243 of the second plane surface 14a2.

Fifth Embodiment

Figure 5:
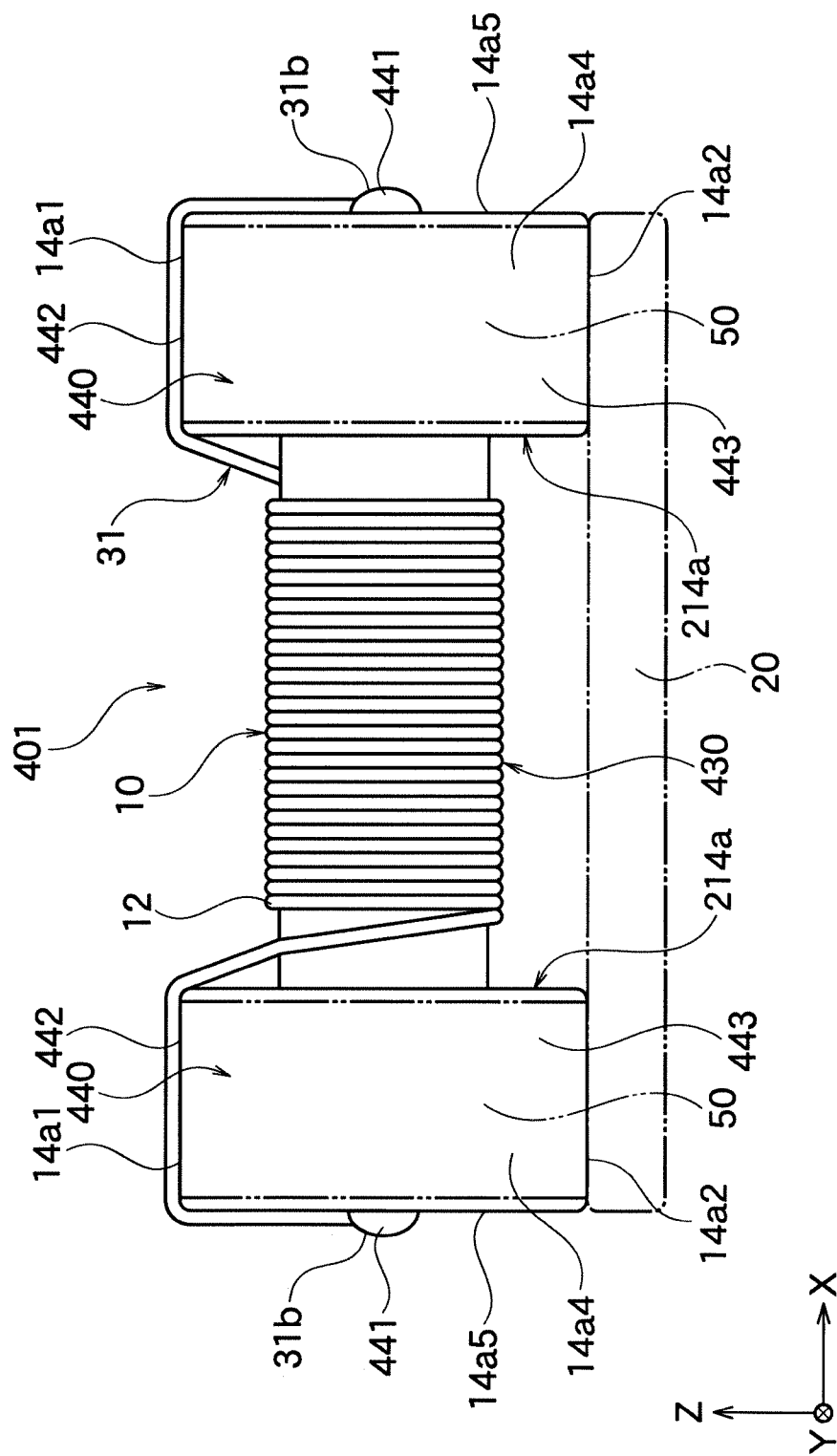
FIG. 5 is a side view of a coil device according to another embodiment of the present invention.

As shown in FIG. 5, a coil device 401 according to the present embodiment is similar to the coil device 301 according to Fourth Embodiment except for the structure of electrodes 440. Hereinafter, different matters from Fourth Embodiment are described in detail, and common matters are not described. Common members are provided with common references in the figures, and the description of common members is partially omitted.

The electrodes 440 are formed by, for example, immersing the flanges 214a and 214a into a dipping liquid of Ag etc., and are respectively formed over the first plane surface 14a1, the second plane surface 14a2, the first side surface 14a3, the second side surface 14a4, and the end surface 14a5 of each flange 214a.

In the illustrated example, the winding core 12 is wound by only the first wire 31, and a coil 430 is formed by winding one or more layers of the first wire 31.

Each of the electrodes 440 is formed by the mount part 442 formed on the first plane surface 14a1 and the mount auxiliary part 443 formed over the second plane surface 14a2, the first side surface 14a3, the second side surface 14a4, and the end surface 14a5, and the mount part 442 and the mount auxiliary part 443 are electrically connected.

In the present embodiment, each of the wire joint parts 441 is formed on the mount auxiliary part 443 of the end surface 14a5. That is, each of the wire joint parts 441 is formed on a surface of the electrode 440 differing from the mount part 442.

As shown in FIG. 5, each of the electrodes 440 is covered with the cover layer 50. In the present embodiment, each cover layer 50 covers a part of the electrode 440 (the mount part 442 and the auxiliary part 243 of the first side surface 14a3, the second side surface 14a4, and the end surface 14a5), but may entirely cover the electrode 440.

In the present embodiment, similar effects to Fourth Embodiment are obtained. In particular, each of the cover film 50 is formed widely on the electrode 440 in the present embodiment, and it is thereby possible to effectively improve a mount strength to a circuit board or so and effectively prevent mount failures.

Incidentally, the first wire 31 is connected with the mount auxiliary parts 443 via the first plane surfaces 14a1 of the flanges 214a. In the illustrated example, but the first wire 31 may be connected with the mount auxiliary parts 443 via the second plane surfaces 14a2 of the flanges 214a. In this case, as shown in FIG. 3A, notches are preferably formed on both sides of the plate member 20 in the Y-axis direction so that the wire ends 31a and 31b of the first wire 31 do not contact with the plate member 20.

Incidentally, the present invention is not limited to the above-mentioned embodiments, and may variously be changed within the scope of the present invention. For example, the electrodes are formed by plating pattern or printing pattern in the above-mentioned embodiments, but may be formed by, for example, a metal terminal fitting.

Two electrodes are formed on each flange 14a in the above-mentioned embodiments, but three or more electrodes may be formed. For example, three electrodes may be formed on each flange 14a in the coil device 1 shown in FIG. 1A.

In this case, two electrodes of the three electrodes formed on each flange 14a are respectively used as the positive terminal IN+ and the negative terminal IN− of the balanced input (the positive terminal OUT+ and the negative terminal OUT− of the balanced input), and the other one electrode is used as an intermediate tap CT on the input side (output side).

Application examples of the present invention to the coil device 1 having the drum core 10 are shown in the above-mentioned embodiments, but the present invention may be applied to a coil device having no drum core.

In the above-mentioned embodiments, the electrodes may be formed by vapor deposition, sputtering, printing etc., and the electrodes may be formed by a metal terminal fitting having an outer shape of substantially "L" shape or substantially "C" shape.

Each of the cover layers 50 is thinner than the electrode 40 in the above-mentioned embodiments, but may be as thick as or thicker than the electrode 40. The method of forming the cover layers 50 is not limited to vapor deposition or sputtering. For example, when thick cover layers 50 are formed, an application method may be employed.

NUMERICAL REFERENCES 1, 101, 201, 301, 401 . . . coil device
  10, 110, 210 . . . drum core
    12 . . . winding core
    14a, 114a, 214a . . . flange
      14a1 . . . first plane surface
      14a2 . . . second plane surface
      14a3 . . . first side surface
      14a4 . . . second side surface
      14a5 . . . end surface
      14a6 . . . side step surface
      14a7 . . . upper step surface
      14a8 . . . inclined surface
  20, 220 . . . plate member
    221 . . . notch
  30, 430 . . . coil
    31 . . . first wire
    32 . . . second wire
      31a, 31b, 32a, 32b . . . wire end
  40, 140, 240, 340, 440 . . . electrode
    41, 141, 241, 341, 441 . . . wire joint part
    42, 142, 442 . . . mount part
      142a . . . first mount part
      142b . . . second mount part
      142c . . . step
    43, 243, 443 . . . mount auxiliary part
  50 . . . cover layer

What is claimed is:

1. A coil device comprising:
    a coil formed by winding a wire covered with an insulation film;
    a core provided with the coil; and
    an electrode having a wire joint part connected to a wire end of the wire by heat treatment such that dregs of the insulation film due to melting of the insulation film during the heat treatment are on the wire joint part,
    wherein:
    a mount surface of the electrode that includes the wire joint part is at least partially covered with a cover layer;
    the cover layer (i) is formed of a deposited film, (ii) covers the wire joint part and the dregs of the insulation film, and (iii) has a top surface that faces away from the wire joint part;
    the thickness of the cover layer is 5 to 20 μm; and
    the top surface of the cover layer has a locally bulging shape at the wire joint part.

2. The coil device according to claim 1, wherein the cover layer is composed of a metal film.

3. The coil device according to claim 2, wherein the metal film contains at least one of Au, Ag, Pt, Cu, Sn, and an alloy containing at least one of these elements.

4. The coil device according to claim 1, wherein the cover layer is formed by a thin film.

5. The coil device according to claim 2, wherein the cover layer is formed by a thin film.

6. The coil device according to claim 1, wherein
    the wire joint part is formed on the mount surface of the electrode, and
    the cover layer covers the wire joint part.

7. The coil device according to claim 2, wherein
    the wire joint part is formed on the mount surface of the electrode, and
    the cover layer covers the wire joint part.

8. The coil device according to claim 1, wherein
    the mount surface of the electrode comprises a first mount surface and a second mount surface connected with the first mount surface via a step formed therebetween, and
    the wire joint part is formed on the second mount surface.

9. The coil device according to claim 2, wherein
    the mount surface of the electrode comprises a first mount surface and a second mount surface connected with the first mount surface via a step formed therebetween, and
    the wire joint part is formed on the second mount surface.

10. The coil device according to claim 1, wherein the wire joint part is formed on a surface of the electrode differing from the mount surface.

11. The coil device according to claim 2, wherein the wire joint part is formed on a surface of the electrode differing from the mount surface.

12. The coil device according to claim 1, wherein
    the core comprises a winding core and flanges formed on both ends of the winding core,
    the wire is wound around the winding core, and
    the electrode is formed on a surface of the flange.

13. The coil device according to claim 2, wherein
the core comprises a winding core and flanges formed on both ends of the winding core,
the wire is wound around the winding core, and
the electrode is formed on a surface of the flange.

14. The coil device according to claim 12, wherein
the electrode further comprises a mount auxiliary surface formed on an end surface of the flange, and
the wire joint part is formed on the mount auxiliary surface.

15. The coil device according to claim 13, wherein
the electrode further comprises a mount auxiliary surface formed on an end surface of the flange, and
the wire joint part is formed on the mount auxiliary surface.

16. The coil device according to claim 1, wherein the electrode comprises a metal terminal fitting, a plating pattern, or a printing pattern.

17. The coil device according to claim 2, wherein the electrode comprises a metal terminal fitting, a plating pattern, or a printing pattern.

* * * * *